United States Patent [19]

Dunn

[11] 4,122,398
[45] Oct. 24, 1978

[54] ELECTRONICALLY CONTROLLABLE FILTER

[75] Inventor: Gerald A. Dunn, Adelphi, Md.

[73] Assignee: The United States of America as represented by the Secretary of the Army, Washington, D.C.

[21] Appl. No.: 837,499

[22] Filed: Sep. 28, 1977

[51] Int. Cl.$^2$ .............................................. H03F 1/36
[52] U.S. Cl. ..................................... 330/107; 330/303
[58] Field of Search ................. 328/167; 330/107, 109, 330/303; 333/80 T

[56] References Cited

U.S. PATENT DOCUMENTS

| | | | |
|---|---|---|---|
| 3,702,405 | 11/1972 | Zwirn et al. ........................ | 330/80 T |
| 3,919,648 | 11/1975 | Uetrecht ............................... | 328/167 |

OTHER PUBLICATIONS

Burr-Brown–Handbook of Operational Amplifier Active R–C Networks, 1966, pp. 42, 43.

*Primary Examiner*—Lawrence J. Dahl
*Attorney, Agent, or Firm*—John R. Utermohle; Barry N. Young

[57] ABSTRACT

An active filter, capable of being electronically controlled over a 50:1 or greater frequency range, while maintaining a fixed filter characteristic and a constant, nearzero DC offset voltage. The filter utilizes passive element-multipliers, either capacitor-multiplier or resistor-multiplier circuits, as the frequency determining networks, depending upon whether the filter is a low-pass or a high-pass filter. Tuning is accomplished by varying the gain of a variable gain amplifier connected in series with the capacitive or resistive element of the multiplier networks. Also disclosed is an implementation of the variable gain amplifier which permits the filter's cut-off frequency to be controlled digitally. The filter may be designed to have any desired type of filter characteristic. Several filter sections may be connected in cascade to provide any desired number of filter poles.

15 Claims, 9 Drawing Figures

$E_o/E_i = 1/[1 + SRC(1-A)]$ $E_o/E_i = 1/[1 + SRC(1-A)]$ $I1 = (E_i - V1)Y_1$  $\quad I3 = V1(1-A)Y_3$  $\quad I5 = (E_o/K)(1-B)Y_5$ $I2 = (V1 - E_o)Y_2$  $\quad I4 = (V1 - E_o/K)Y_4$

ELECTRONICALLY CONTROLLABLE FILTER

BACKGROUND AND SUMMARY OF THE INVENTION

This invention relates generally to active filters and more particularly to low-pass and high-pass active filters which are electronically controllable over a large frequency range.

Networks using active elements, such as operational amplifiers, and only resistors and capacitors, permit the realization of circuits with responses characterized by having complex, left-hand, s-plane poles. The location of these poles in the complex s-plane and hence the frequency response of these networks is determined by the values of the R and C components used. This makes such circuits useful as active filters, while obviating the need for inductances which are bulky and sometimes difficult to realize practically. This is a significant advantage. For example, active filters operating at low frequencies can be physically quite small and light-weight in comparison to conventional tuned filters employing LC resonant circuits. Furthermore, since the response of such filters can be varied by changing the values of the RC components, they can be tuned relatively easily. For example, U.S. Pat. No. 3,607,567 to Webb, discloses an active filter employing a voltage amplifier in which a feedback network interconnects the amplifier output and a passive RC network. By regulating the values of the load resistor and capacitor, the location of complex poles relative to zeros produced by the active filter, can be adjusted separately and independently, thereby providing different frequency-selectivity characteristics. Different frequency characteristics may also be realized by adjustment of the amplifier gain.

The ability to adjust the frequency response of an active filter by selecting the values of the R and C frequency determining elements makes active filters particularly adpatable to tuning. For example, tuning may be accomplished by mechanically varying the values of the frequency determining elements, such as by using variable capacitors and potentiometers. This makes active filters particularly useful in signal processing applications, where it is desirable to be able to tune a filter to accommodate different input signals. Active filters are also adaptable to electronic tuning, and are useful where the signal environment is dynamic and filters must be quickly and easily tuned to optimize processing.

There are various ways of electronically tuning active filters. One such method is disclosed in U.S. Pat. No. 3,528,040 to Galvin, in which photo-sensitive resistors are used in the frequency determining network. The resistance of these photosensitive resistors is a function of the intensity of the light which is being used to illuminate them. Therefore, by controlling the light's intensity, their resistance value can be varied and hence the filter can be tuned.

Another method of electronically tuning an active filter is illustranced in Graeme, J. G., *Designing With Operational Amplifiers*, Burr-Brown Electronic Series, McGraw-Hill, New York, 1977, pp 118-121. A multiplying D/A converter is employed in a feedback loop around the active filter's operational amplifier, to multiply the feedback voltage by a factor which is proportional to the value of an input digital word. This causes the voltage impressed on a frequency determining element to be increased by the same factor, thereby increasing the current through that component. The component's value is thus effectively divided by the multiplication factor. This results in changes in the circuit's time constants and hence controls the filter. Since the multiplying D/A converter is included in a feedback loop, control is achieved only if the gain constant of the multiplying D/A converter is positive. Otherwise, the polarity of the feedback voltage would be incorrect and the circuit would become unstable. In place of a multiplying D/A converter, a 2-quadrant or 4-quadrant multiplier could also be used to accomplish the same multiplying effect.

The control of many active filters is complicated by the fact that in some cases there is an interaction between the frequency-determining networks. This requires that they be isolated with buffer amplifiers. Furthermore, the filter's damping factor determines the filter's characteristic. Since the damping factor is a function of the ratio of the filter-component values, where the ratio of these components is changed, as when the filter is tuned, the shape of the filter can also change. This makes it difficult to maintain constant a desirable filter characteristic and to exercise precise control over the filter characteristics as it is tuned over a large range.

There is another disadvantage that is encountered in using active filters, particularly low-pass filters which are DC coupled. Active filters typically use operational amplifiers as their active elements. Since these amplifiers have bias and/or bias-leakage currents, they are subject to DC voltage offsets due to the resultant voltage produced by these currents flowing through circuit resistances. In addition, these amplifiers typically have a differential offset voltage through them. These DC offset voltages can change as the filter is tuned. Furthermore, these DC offset voltages can limit the dynamic range of the filter since they can become significantly large compared to the signal of interest.

It is desireable therefore to provide a new and improved, electronically controllable active filter which overcomes the aforesaid disadvantages, and it is to this end that the present invention is directed.

Accordingly, it is an object of the invention to provide an electronically controllable filter which is tunable over a large frequency range, while maintaining a fixed-filter characteristic and a constant, near-zero DC offset voltage.

It is a further object of the invention to provide a filter which may be cascaded with other filter sections to provide any desired number of poles or zeros.

It is also an object of the invention to provide a filter which may have any desired filter-response characteristic, i.e., Butterworth, Bessel, Chebyshev, etc.

It is additionally an object of the invention to provide a filter which may be tuned without changing the component values of the frequency-determining elements and which is tunable over a 50:1 or greater frequency range.

These and other advantages may be obtained in an active filter which has at least one passive element-multiplier frequency-determining network connected to the input of a first amplifier, which amplifier has a feedback path connected to its output and the passive element-multiplier network, for feeding back a portion of the output of the first amplifier to the passive element-multiplier network.

BRIEF DESCRIPTION OF THE DRAWINGS

FIG. 1c is a generalized equivalent circuit for the filter of FIG. 1a.

FIG. 2 is a schematic diagram of a digitally controlled variable gain amplifier, useful in controlling the filter of FIG. 1a.

DETAILED DESCRIPTION OF THE PREFERRED EMBODIMENTS

Figure 1A:
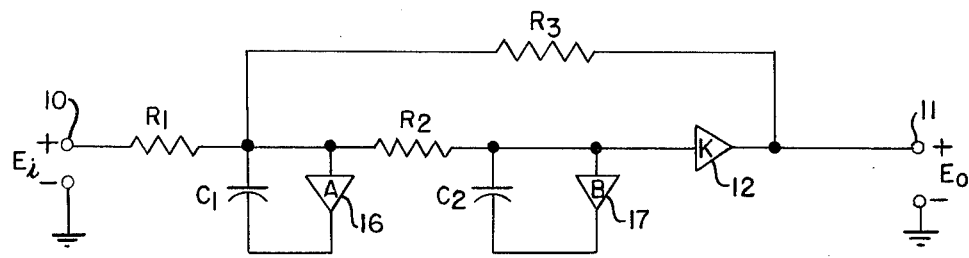
FIG. 1a is a circuit diagram of an electronically controllable, low-pass filter, embodying the elements of the invention.

An active filter embodying the elements of the invention is illustrated in FIG. 1a. The filter illustrated is a two pole, low-pass filter. An input signal, $E_i$, on terminal 10 is low-pass filtered to provide an output, $E_o$, on terminal 11. Connected to input terminal 10, are two capacitor-multiplier circuits, which may be referred to generically as passive element-multiplier frequency-determining networks, connected in tandem to the input of an operational amplifier 12, having a gain of K. The filter output is taken from the output of amplifier 12, which is connected to terminal 11. A feedback path, through a resistor $R_3$ connected to the output of amplifier 12, interconnects the amplifier output and the two capacitor-multiplier circuits connected to its input.

Figure 1B:
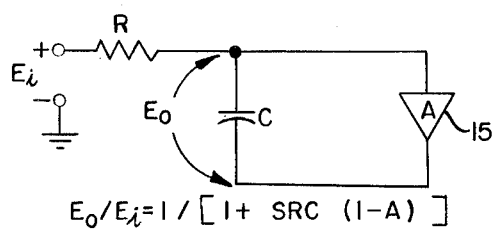
FIG. 1b is a circuit diagram of a capacitor-multiplier circuit.

FIG. 1b illustrates one section of a simple capacitor-multiplier circuit, as an example of a passive element-multiplier useful in practicing the invention. It comprises an R/C network with a voltage amplifier 15 having a gain A, in series connection with capacitor C. The transfer function of the capacitor-multiplier circuit illustrated in FIG. 1b is $$E_o/E_i = 1/[1 + sRC(1 - A)], \quad (1)$$

where A is the gain of the ideal voltage amplifier 15, and $s$ is the Laplacian operator. The cut-off frequency of this circuit is therefore $$f_c = 1/[2 \pi RC(1 - A)]. \quad (2)$$

Clearly, equation (2) shows that for a given R and C, the cut-off frequency of the capacitor-multiplier circuit can be adjusted by varying the gain A of the amplifier 15. Furthermore, equation (1) shows that the simple capacitor-multiplier circuit has a single-pole, (first-order) low-pass filter response.

Another type of passive element-multiplier frequency-determining network, which is similar to the capacitor-multiplier, is the resistor-multiplier, herein later described in connection with the description of a high-pass filter. The resistor-multiplier, obtained by reversing the R and the C passive elements of the circuit of FIG. 1a, also has a single-pole frequency response.

In FIG. 1a, $R_1$, $C_1$ and voltage amplifier 16 form a capacitor-multiplier circuit similar to that illustrated in FIG. 1b. A second capacitor-multiplier circuit comprising $R_2$, $C_2$ and voltage amplifier 17 is connected in tandem to produce a second-order transfer function, whose natural frequency can be adjusted by adjusting the gains, A and B, of amplifiers 16 and 17.

Figure 1C:
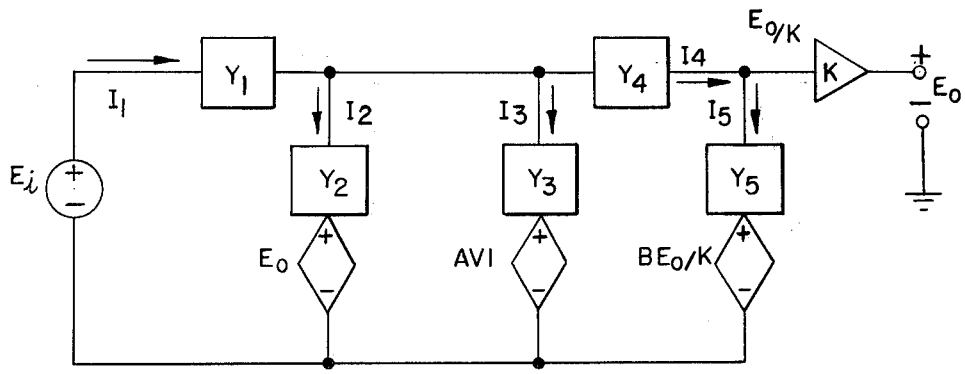

FIG. 1c shows a generalized equivalent circuit of the filter of FIG. 1a. $Y_1$, $Y_2$ and $Y_4$ are conductances and $Y_3$ and $Y_5$ are capacitor admittances. Node equations, relating the currents flowing in each branch of the equivalent circuit to the Y's and voltages at various points in the circuit are also illustrated in FIG. 1c. Manipulation of these node equations yields the following transfer function for the filter, $$E_o/E_i = KY_1Y_4/[Y_5(1-B)[Y_1+Y_2+Y_3(1-A) + Y_4] + [Y_1 + (1-K)Y_2 + Y_3(1-A)]Y_4] \quad (3)$$

The standard form of the transfer function for a second-order low-pass system is $$\frac{E_o}{E_i} = \frac{\omega_n^2}{s^2 + 2\delta\omega_n s + \omega_n^2} \quad (4)$$

where $\omega_n$ is the natural frequency and where $\delta$ is the damping factor. Equation (3) may be simplified and converted to this standard form by setting A = B and substituting $$Y_1 = 1/R_1 \quad Y_3 = sC_1 \quad Y_5 = sC_2 \quad (5)$$
$$Y_2 = 1/R_3 \quad Y_4 = 1/R_2$$

With these substitutions, rearranging equation (3) and equating like terms, permits the filter parameters to be expressed in terms of the circuit parameters. Thus, the natural frequency of the filter is given by $$f_n = \frac{1}{2\pi(1-A)} \left[ \frac{1 + (1-K)(R_1/R_3)}{R_1R_2C_1C_2} \right]^{\frac{1}{2}} \quad (6)$$

and the damping factor, $\delta$, is given by $$\delta = \frac{1}{2[1 + (1-K)(R_1/R_3)]^{\frac{1}{2}}} \left[ \left(\frac{R_2C_2}{R_1C_1}\right)^{\frac{1}{2}} + \left(\frac{R_1C_2}{R_2C_1}\right)^{\frac{1}{2}} + \left(\frac{R_1R_2C_2}{R_3^2C_1}\right)^{\frac{1}{2}} + \left(\frac{R_1C_1}{R_2C_2}\right)^{\frac{1}{2}} \right] \quad (7)$$

The DC gain of the filter, $G_o$, is given by $$G_o = \frac{K}{1 + (1-K)(R_1/R_3)} \quad (8)$$

Equations (6) and (7) express the filter characteristics in terms of the circuit parameters. Inspection of equation (6) indicates that the circuit's natural, or cut-off frequency, can be adjusted by simultaneously varying the gain A of amplifiers 16 and 17. Furthermore, since equation (7) does not contain the term A, the damping factor is independent of A. These equations indicate that the filter's natural frequency may be adjusted by varying the gain A of amplifiers 16 and 17, while maintaining a constant damping factor which is independent of A. Therefore, as the filter's cut-off frequency is varied, its shape remains constant.

Theoretically, the gain A could take on any value less than +1, but preferably, it should be kept below about +0.75, since the change in cut-off frequency becomes too great for values much greater than this. Furthermore, since the gains of practical variable gain amplifiers will not track perfectly, the filter's shape may change for gains in the order of +0.9 or greater, due to the very rapid change in cut-off frequency. Negative gain, however, is limited only by the input signal amplifier to that which would cause amplifier saturation. For applications where only a small range of cut-off frequencies is desired, only positive or negative values of A could be used. However, for larger ranges in cut-off frequency, A may be permitted to take on both positive and negative values.

The filter of FIG. 1a may also be designed to have any desired filter characteristic, i.e., Butterworth, Bessel, Chebyshev, etc., by proper selection of the circuit component values. Various references are available having tables which give numerical values for the various terms of the standard transfer function for various types of filters. For example, one such reference is Huelsman, L. P., Graeme, J. G., Tobey, G. E., *Operational Amplifiers; Design and Applications*, Burr-Brown, McGraw-Hill, New York, NY, 1971, pp 320–325.

The filter of FIG. 1a may be controlled over a 50:1 frequency range before the filter's shape factor is appreciably changed. Furthermore, several filter sections may be cascaded in order to provide a higher order filter.

Variable gain amplifiers 16 and 17 may be implemented in a number of ways. A particularly convenient way of providing variable gain amplifiers with closely matched gains is with a multiplying D/A converter. This device accepts an analog input voltage and provides an output current proportional to both the analog input and a digitally applied word.

Figure 2:
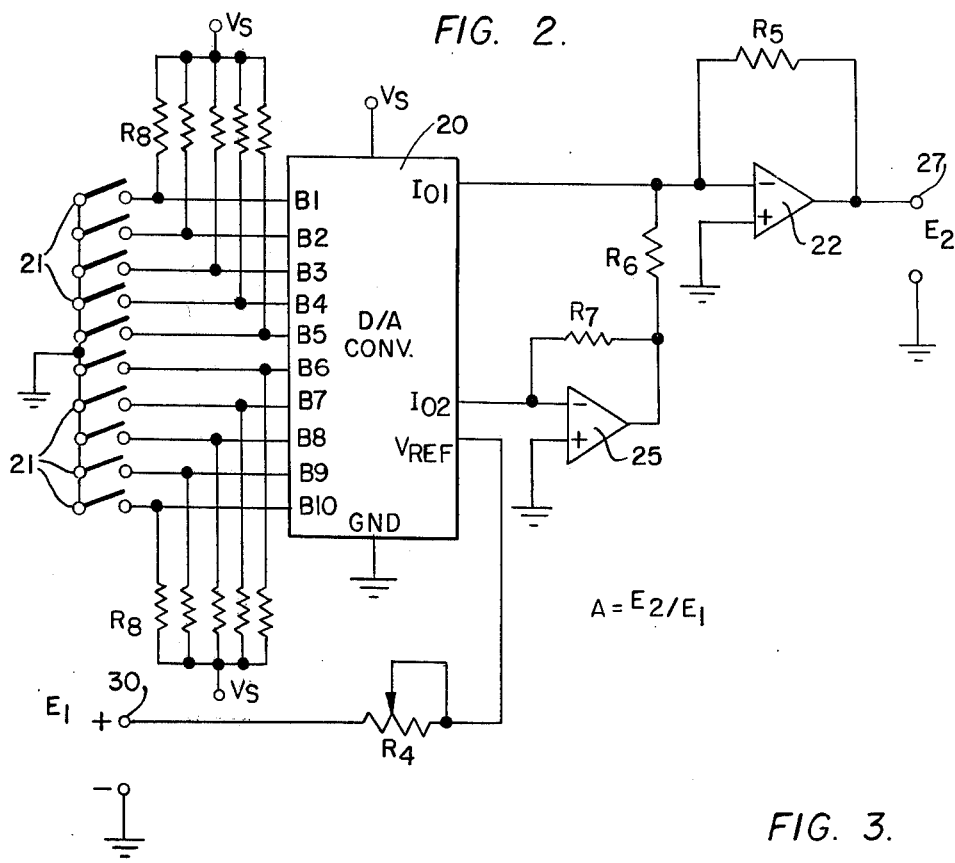

FIG. 2 illustrates such a variable gain circuit, using a multiplying D/A converter, 20. An input voltage, $E_1$, at terminal 30 is applied to the voltage reference input of D/A converter 20 through trimmer resistor $R_4$. A ten-bit digital word is supplied to inputs B1-B10 by switches 21-21. D/A converter 20 has two current outputs, $I_{o1}$ and $I_{o2}$. Output $I_{o1}$ is supplied to the negative input of operational amplifier 22. Feedback around amplifier 22 is provided by resistor $R_5$. Output $I_{o2}$ is fed to the negative input of a second operational amplifier 25, whose output is connected through resistor $R_6$ to the negative input of amplifier 22. Resistor $R_7$ forms a feedback path around amplifier 25. The plus inputs of both amplifiers 22 and 25 are grounded. The output of amplifier 22 provides the circuit output voltage, $E_2$, to terminal 27. $E_2$ is proportional to the input voltage $E_1$ on terminal 30 and the digital word appearing at inputs B1-B10.

Switches 21-21 are individually operated and serve to ground one or more of the inputs B1-B10 to provide the input digital control value. Inputs B1-B10 are also connected to pull-up resistors R8-R8 connected to the circuit supply voltage, $V_s$. This maintains each of the inputs B1-B10 at a logic 1 input level, until the corresponding one of switches 21-21 is closed, grounding that input. The sum of $I_{o1}$ and $I_{o2}$ is directly proportional to the input signal $E_1$ at terminal 30. The value of $I_{o1}$ is then defined by the input signal and the digital control input on B1-B10. When all of the digital inputs are at logic 0, as when switches 21-21 are all closed, current $I_{o1}$ is zero and all of the current is directed to output $I_{o2}$.

The circuit of FIG. 2 provides a bipolar output voltage. The $I_{o1}$ output from D/A converter 20 to amplifier 22, provides the negative gain value, while the $I_{o2}$ output to amplifier 25 provides the positive-gain values. Resistors $R_5$, $R_6$ and $R_7$ define the relationship between most positive and most negative gains. Properly selecting the values of these resistors can prevent the possibility of the positive gain equalling or exceeding unity and permits full advantage to be taken of the input digital control range. The input variable resistor, $R_4$, adjusts the gain limits.

Figure 3:
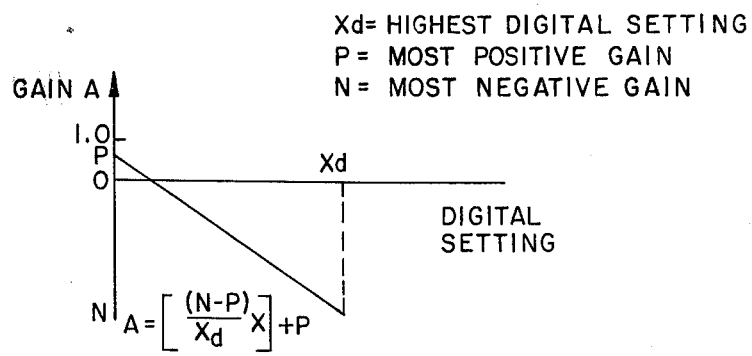
FIG. 3 illustrates graphically, the functional relationship between the gain of the variable gain amplifier of FIG. 2 and its digital-control input.
Figure 6:
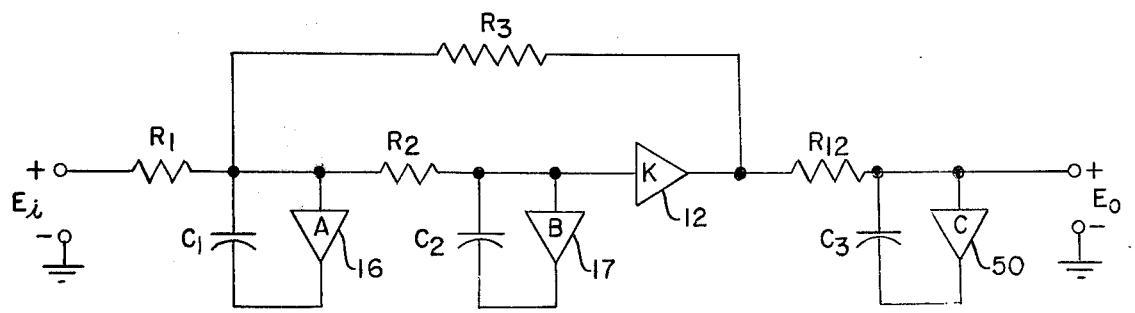
FIG. 6 illustrates the addition of a third pole to the filter of FIG. 1a, to provide a third-order filter response.

FIG. 3 illustrates graphically the relationship between the circuit gain A and the digital control input. If N is the most negative gain required, it occurs when all inputs are at logic 1 and $$N = R_5/R_x, \text{ or } R_x = R_5/N,$$

where $R_x$ is the output resistance of the $I_{o1}$ port.

The most positive gain, P, when all digital inputs are at logic 0, is $$P = (R_5/R_6)(R_7/R_x).$$

Since $R_x = R_5/N$, then $P = (R_7/R_6) N$. Since the output resistance, $R_x$, may vary from device to device, trimmer resistor $R_4$ is used to trim the negative gain, N. Since P is related to N as shown above, this trimmer resistor also establishes both gain limit values.

A suitable D/A converter for use in the circuit of FIG. 2 is an AD7520, manufactured by Analog Devices, Inc. Amplifiers 22, 25 may be National Semiconductor LM747 op amps. If the maximum negative gain, N, is set to −7 and the maximum positive gain, P, is set to approximately 0.65, the cut-off frequency range for the filter of FIG. 1a will be greater than 20:1. For these gain limits, suitable values for the circuit components are $R_5 = R_6 = 120K$ ohms, $R_7 = 11K$ ohms. The output resistance of the $I_{o1}$ port of an AD7520 is approximately 10K ohms, for the maximum negative gain condition. Therefore, $R_4$ may be 5K ohms. A suitable value for pull-up resistors R8-R8 is 20K ohms.

As illustrated in FIG. 3, for a given N and P, there is a linear relationship between the gain A and the input digital control value X.

Figure 4:
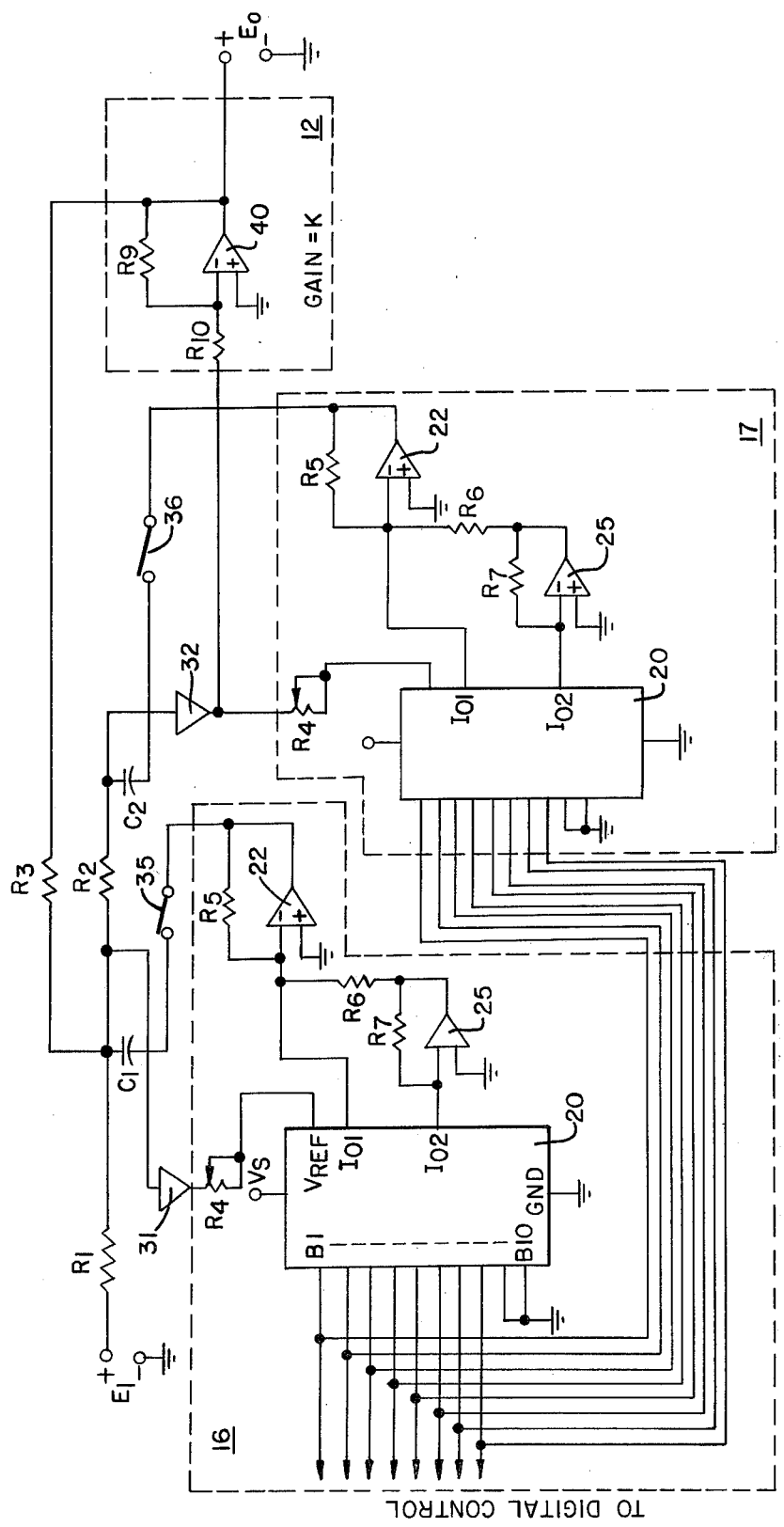
FIG. 4 is a detailed schematic of the second-order low-pass filter of FIG. 1a, illustrating the use of the variable gain amplifier of FIG. 2 for control purposes.

FIG. 4 is a schematic of the low-pass filter of FIG. 1a, using the variable gain amplifier of FIG. 2 for amplifiers 16 and 17. Since equation (3) was simplified by letting gains A and B be equal, amplifiers 16 and 17 may be implemented using identical circuits having a common digital control.

The digital control input for the filter, not illustrated, is fed in parallel to both amplifiers 16 and 17. To eliminate any resistive loading which may be caused by amplifiers 16 and 17 to the filter, unity gain, low-bias-current voltage buffer amplifiers 31 and 32 have been added to the inputs of variable gain amplifiers 16 and 17. These low-bias-current amplifiers minimize DC-offset voltages which may be caused by bias currents flowing through circuit resistances, thereby producing a voltage drop, which results in a voltage off-set through the filter. Since the filter's resistance values are held constant as the filter is controlled, the voltage drop across them caused by bias currents, and hence the voltage off-set, remains constant. This is an advantage over known active filters which require the circuits effective resistor values to be varied to control the filter. The use of low-bias-current devices results in this constant voltage off-set being a small value, which can easily be made to be near-zero using an off-set balance control on the amplifiers. Amplifiers 22-22 and 25-25 do not have to be low-bias-current devices, since their outputs drive capacitors which block any DC offset voltage.

Switches 35 and 36 provide a convenient way to adjust the gain of the two variable gain amplifiers 16 and 17. With the two switches open, and a logic 1 at all digital inputs B1-B8, the gain of each variable gain amplifier 16, 17, is adjusted to its most negative value, N, with variable resistor $R_4$. Switches 35 and 36 are then closed to permit normal filter operation.

Voltage amplifier 12 of FIG. 4, may be implemented with an operational amplifier 40, having a feedback path $R_9$ from its output to its negative input. The input to amplifier 12 is derived from the output of low-bias-current, low off-set voltage amplifier 32, through resistor $R_{10}$ connected to the negative input of amplifier 40. The gain, K, of amplifier 12 is equal to the negative of the ratio $R_9/R_{10}$, and is easily set to its desired value by adjusting this ratio. In order for the filter to maintain a near zero DC offset voltage, amplifier 40 should also be a low-bias-current, low off-set voltage amplifier. A suitable device for this purpose is a type LM308 operational amplifier. Suitable devices for amplifiers 31 and 32 are type LM310 operational amplifiers.

To illustrate with a specific example of a filter design, assume that it is desired to design a low-pass filter having a cut-off frequency which varies from 50Hz to 1000Hz, a 20:1 frequency range, and having a Butterworth filter response. For a two pole Butterworth filter, the previously cited 1971, Burr-Brown reference by Huelsman et al., at page 320, indicates that a damping factor $\delta = \sqrt{2}/2$ is required, where $2\delta = a$, the value given in the Burr-Brown reference. To simplify equation (7), let $R_1 = R_2 = R_3 = R$, and $C_1 = C_2 = C$. Then $$\delta = \frac{2}{(2-K)^{\frac{1}{2}}}. \qquad (9)$$

Solving for K gives $$K = 2 - 4/\delta^2 = -6, \qquad (10)$$

where $\delta = \sqrt{2}/2$.

Solving equation (6) for C yields $$\frac{(2-K)^{\frac{1}{2}}}{2\pi f_c R(1-A)} \qquad (11)$$

where the natural frequency, $f_n$, is equal to the cut-off frequency, $f_c$. Using the previously given component values for $R_5$, $R_6$ and $R_7$ which resulted in a 20:1 frequency range for the variable amplifier of FIG. 2, and a maximum negative gain of $A = -7$, pick $R = 10K$ ohms. Then, with $f_c = 50Hz$, and $K = -6$, equation (11) gives a value of $C = 0.12$ microfarads. From equation (8) the DC gain of the filter is $-\frac{3}{4}$. To set the gain $K = 6$ of amplifier 12, $R_9$ may be selected to be 120K ohms and $R_{10}$ selected to be 20K ohms.

Figure 5:
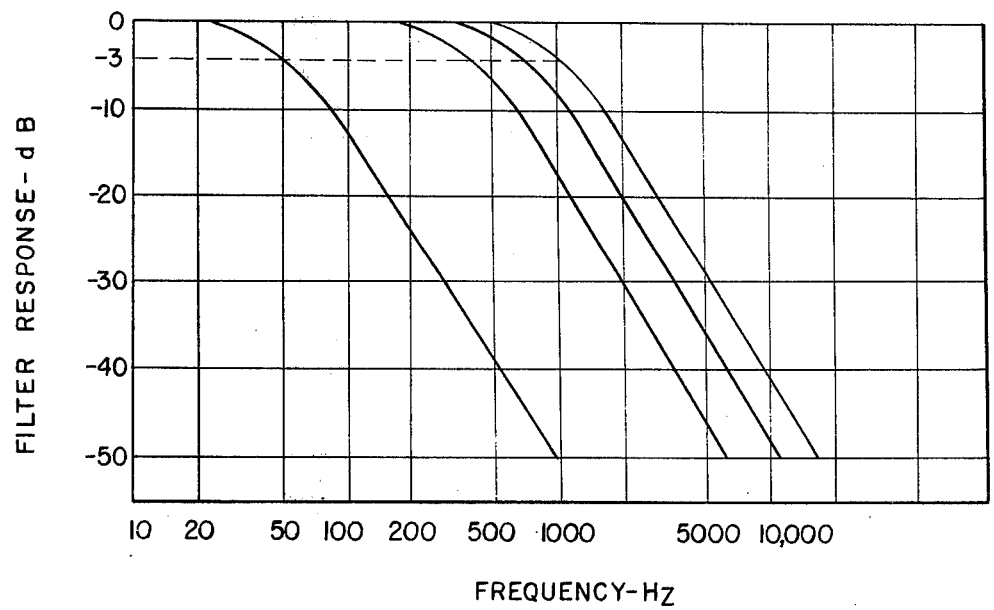
FIG. 5 gives the frequency response for various cut-off frequencies of an example filter designed in accordance with the principles of the invention.

FIG. 5 is a plot of the low-pass filter's frequency response at several different cut-off frequencies between 50Hz and 1000Hz. As illustrated, the filter has the same shape (filter response characteristic) at each of the cut-off frequencies shown.

Figure 7:
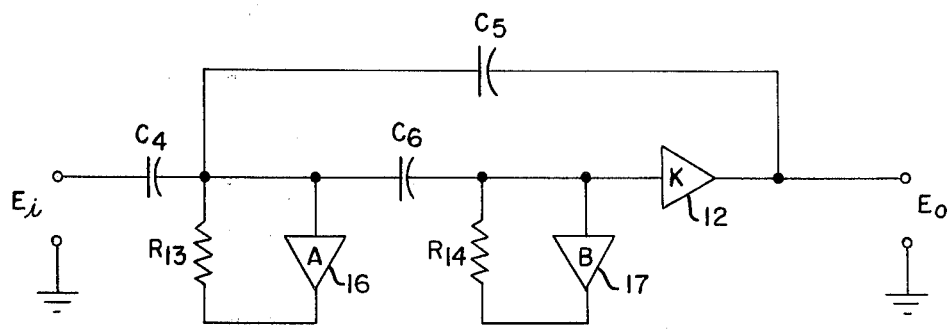
FIG. 7 is a circuit diagram of an electronicall controllable, high-pass filter embodying the elements of the invention.

If a filter having more than two poles is desired, several of the filter sections illustrated in FIG. 1a may be cascaded to obtain any given number of poles desired. Furthermore, a third pole can be easily added to the basic filter section illustrated in FIG. 1a, by adding an additional capacitor-multiplier stage to either its output or its input. FIG. 7 illustrates a three-pole filter constructed by adding a third capacitor-multiplier, comprising $R_{12}$, $C_3$ and amplifier 50, to the output of filter of FIG. 1a to provide a third, real pole. In such cases, the required damping factors may be conveniently obtained from the previously cited Burr-Brown reference.

The low-pass filter of FIG. 1a may be converted into a high-pass filter by taking its dual, obtained by replacing the resistors with capacitors and the capacitors with resistors. Such a high-pass filter is illustrated in FIG. 7. Resistor-multipliers, which are the duals of the capacitor-multiplier of FIG. 1c, are the passive element-multiplier frequency-determining elements of the high-pass filter. The two resistor-multipliers of the filter of FIG. 7, $C_4$, $R_{13}$, amplifier 16 and $C_6$, $R_{14}$, amplifier 17, respectively, provide a second-order high-pass filter function.

The equations relating the high-pass filter parameters to the values of the circuit elements can be obtained in a manner similar to the one previously described for the low-pass filter. The standard form of the transfer function for a second-order high-pass system is $$\frac{E_o}{E_i} = \frac{G_o s^2}{s^2 + 2\delta\omega_n^2 s + \omega_n^2}. \qquad (12)$$

For the high-pass filter of FIG. 7, the admittances of the generalized equivalent circuit of FIG. 1c are $$Y_1 = sC_4 \quad Y_3 = 1/R_{13} \quad Y_5 = 1/R_{14} \qquad (13)$$

$$Y_2 = sC_5 \quad Y_4 = sC_6$$

Substituting these values into equation (3) for the transfer function of FIG. 1c and letting the gains A and B of the amplifiers 16 and 17 be equal to A, equation (3) may be rearranged to the standard form given by equation (12). Equating terms, the high-pass filter parameters are found to be $$f_n = \frac{1-A}{2\pi [R_{13}R_{14}C_6(C_4 + C_5(1-K))]^{1/2}} \qquad (14)$$

and $$\delta = \frac{R_{13}(C_4 + C_5) + C_6(R_{13} + R_{14})}{2[R_{13}R_{14}C_4C_6 + R_{13}R_{14}C_5C_6(1-K)]^{1/2}}. \qquad (15)$$

As before, the above equations show that the natural frequency of the filter can be controlled by controlling the gain A of the amplifiers 16 and 17 and that the damping factor of the filter is independent of A. Therefore, the filter response characteristic remains constant as the filter is controlled.

Variable gain amplifiers 16 and 17 may be implemented as previously described and illustrated in FIG's 2 and 4. Furthermore, since the high-pass filter of FIG. 7 does not have a DC path through it as does the low-pass filter, DC off-set voltages are not a problem. Thus, low-bias-current devices are not required for the high-pass configurations.

Equations (14) and (15) may be further simplified if desired, by setting $C_4 = C_5 = C_6 = C$ and $R_{13} = R_{14} = R$. As in the low-pass filter example, the values of the filter parameters may be obtained from tables of filter parameters, such as given in the previously cited Burr-Brown reference, and the values of the circuit elements easily determined. As in the low-pass case, the high-pass filter may be designed to have any desired type of filter response characteristic, i.e., Butterworth, Chebyshev, etc., and any desired number of poles. Furthermore, several of the filters of FIG. 7 may be connected in cascade to provide a higher-order filter.

While the foregoing has been with reference to specific embodiments, it will be appreciated by those skilled in the art that numerous changes and modifications may be made without departing from the spirit and the intent of the invention. It is intended that the invention be limited only by the appended claims.

What is claimed is:

1. An electronically controllable filter comprising:
    a first amplifier having input and output terminals;
    at least one passive element-multiplier, frequency-determining network connected to the input terminal of said first amplifier, said passive element-multiplier network comprising at least two passive elements connected together and having a variable gain second amplifier connected in series with one of said passive elements; and
    a feedback path connected between the output terminal of said first amplifier and said passive element-multiplier network, for feeding back a portion of the output from said first amplifier to said passive element-multiplier network.

2. The filter of claim 1 further comprising means for varying the gain of said variable gain second amplifier, thereby controlling the cut-off frequency of the filter.

3. The filter of claim 2 wherein said means for varying the gain of said variable gain amplifier includes digital control means.

4. The filter of claim 2 further comprising a second passive element-multiplier network connected in cascade with said first passive element-multiplier network on said first amplifier input, thereby providing a filter having a second-order filter response characteristic.

5. The filter of claim 4 wherein said filter is controlled by simultaneously controlling the gains of said variable gain second amplifiers of said passive element-multiplier networks.

6. The filter of claim 4 further comprising a third passive element-multiplier network connected to said first amplifier output, for providing a third-order filter response characteristic.

7. The filter of claim 4 wherein higher-order filter response characteristics may be obtained by cascading several of said filters to provide a filter having the desired number of poles.

8. The filter of claim 5 wherein the damping factor of the filter may be selected by adjusting the ratios of the values of the circuit elements of said filter and the gain of said first amplifier, to provide a filter having any desired type of filter response characteristic.

9. The filter of claim 8 wherein the damping factor of the filter is independent of the cut-off frequency of the filter, thereby providing a constant filter response characteristic as the filter is controlled.

10. The filter of claim 1 wherein said first amplifier is a low-bias-current amplifier, thereby resulting in a filter having a constant, near-zero DC offset voltage.

11. The filter of claim 1 wherein said passive element-multiplier network is a capacitor-multiplier circuit and the filter is a low-pass filter.

12. The filter of claim 1 wherein said passive element-multiplier network is a resistor-multiplier circuit and the filter is a high-pass filter.

13. An electronically controllable low-pass filter comprising:
    a first amplifier having an input and an output;
    two or more capacitor-multiplier circuits connected in cascade to said amplifier input, each of said capacitor-multiplier circuits including a resistor element connected to a capacitor element and a variable gain second amplifier connected in series with said capacitor element;
    a feedback path connected between the output of said first amplifier and said capacitor-multiplier circuits for feeding back a portion of said first amplifier output to its input; and
    means for simultaneously varying the gains of each of said variable gain second amplifiers, thereby controlling the cut-off frequency of said filter.

14. The filter of claim 13 wherein the filter is controlled without varying the values of the resistor or capacitor elements of said filter, thereby providing a filter having a constant DC offset voltage and a fixed filter response characteristic, which are independent of the cut-off frequency of said filter.

15. An electronically controllable high-pass filter comprising:
    a first amplifier having an input and an output;
    two or more resistor-multiplier circuits connected in cascade to said amplifier input, each of said resistor-multiplier circuits including a capacitor element connected to a resistor element and a variable gain second amplifier connected in series with said resistor element;
    a feedback path connected between the output of said first amplifier and said resistor-multiplier circuits for feeding back a portion of said first amplifier output to its input; and
    means for simultaneously varying the gains of each of said variable gain second amplifiers, thereby controlling the cut-off frequency of said filter.

* * * * *